US009799602B2

(12) United States Patent
Chang et al.

(10) Patent No.: US 9,799,602 B2
(45) Date of Patent: Oct. 24, 2017

(54) INTEGRATED CIRCUIT HAVING A STAGGERED FISHBONE POWER NETWORK

(71) Applicant: Taiwan Semiconductor Manufacturing Co., Ltd., Hsin-Chu (TW)

(72) Inventors: Kuang-Hung Chang, Hsin-Chu (TW); Wen-Hao Chen, Hsin-Chu (TW); Yuan-Te Hou, Hsin-Chu (TW); Kumar Lalgudi, Fremont, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/983,797

(22) Filed: Dec. 30, 2015

(65) Prior Publication Data

US 2017/0194252 A1  Jul. 6, 2017

(51) Int. Cl.
*H01L 23/00* (2006.01)
*H01L 21/76* (2006.01)
*H01L 23/528* (2006.01)
*H01L 23/522* (2006.01)
*H01L 21/768* (2006.01)

(52) U.S. Cl.
CPC .... *H01L 23/5283* (2013.01); *H01L 21/76877* (2013.01); *H01L 21/76895* (2013.01); *H01L 23/5226* (2013.01); *H01L 23/5286* (2013.01)

(58) Field of Classification Search
CPC ....... H01L 23/5226; H01L 2924/01078; H01L 2924/01079; H01L 23/481; H01L 2924/01029; H01L 21/76877; H01L 21/76895; H01L 23/5286

See application file for complete search history.

(56) References Cited

U.S. PATENT DOCUMENTS

| 8,421,205 | B2 | 4/2013 | Yang |
| 8,661,389 | B2 | 2/2014 | Chern et al. |
| 8,698,205 | B2 | 4/2014 | Tzeng et al. |
| 8,826,212 | B2 | 9/2014 | Yeh et al. |
| 8,836,141 | B2 | 9/2014 | Chi et al. |
| 8,875,076 | B2 | 10/2014 | Lin et al. |
| 9,147,029 | B2 | 9/2015 | Ke et al. |
| 2006/0083064 | A1* | 4/2006 | Edahiro ............... G11C 7/12 365/185.17 |
| 2014/0264924 | A1 | 9/2014 | Yu et al. |
| 2014/0282289 | A1 | 9/2014 | Hsu et al. |

(Continued)

*Primary Examiner* — Marcos D Pizarro
*Assistant Examiner* — Long H Le
(74) *Attorney, Agent, or Firm* — Duane Morris LLP

(57) ABSTRACT

An integrated circuit includes: a first spine formed on a first conductive layer of the integrated circuit, the spine runs in a first direction; a first plurality of ribs formed on a second conductive layer of the integrated circuit, the first plurality of ribs run parallel to one another in a second direction that is orthogonal to the first direction and overlap respective portions of the first spine; a first plurality of interlayer vias formed between the first and second conductive layers, each of the plurality of interlayer vias electrically couple respective ones of the first plurality of ribs to the first spine at the respective portions of overlap; and a plurality of signal lines formed on the second conductive layer and running parallel to one another in the second direction.

18 Claims, 13 Drawing Sheets

(56) References Cited

U.S. PATENT DOCUMENTS

| | | |
|---|---|---|
| 2015/0279453 A1 | 10/2015 | Fujiwara et al. |
| 2015/0318241 A1 | 11/2015 | Chang et al. |
| 2015/0347659 A1 | 12/2015 | Chiang et al. |
| 2015/0357279 A1 | 12/2015 | Fujiwara et al. |
| 2016/0012169 A1 | 1/2016 | Chiang et al. |

* cited by examiner

INTEGRATED CIRCUIT HAVING A STAGGERED FISHBONE POWER NETWORK

BACKGROUND

This disclosure relates to power networks of integrated circuits. Typically, a power network of an integrated circuit (IC) chip includes a plurality of layers of conductive lines which are arranged, for example, as a mesh network, and a plurality of interlayer vias that interconnect different layers of conductive lines. In the mesh network, conductive lines in an upper layer of the IC cross over conductive lines in a lower layer. Corresponding to where the conductive lines in the upper layer overlap with the conductive lines in the lower layer, interlayer vias and conductive segments in intermediate conductive layers are disposed to conductively couple the conductive lines in the upper layer with the conductive lines in the lower layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF EXEMPLARY EMBODIMENTS

Figure 1A:
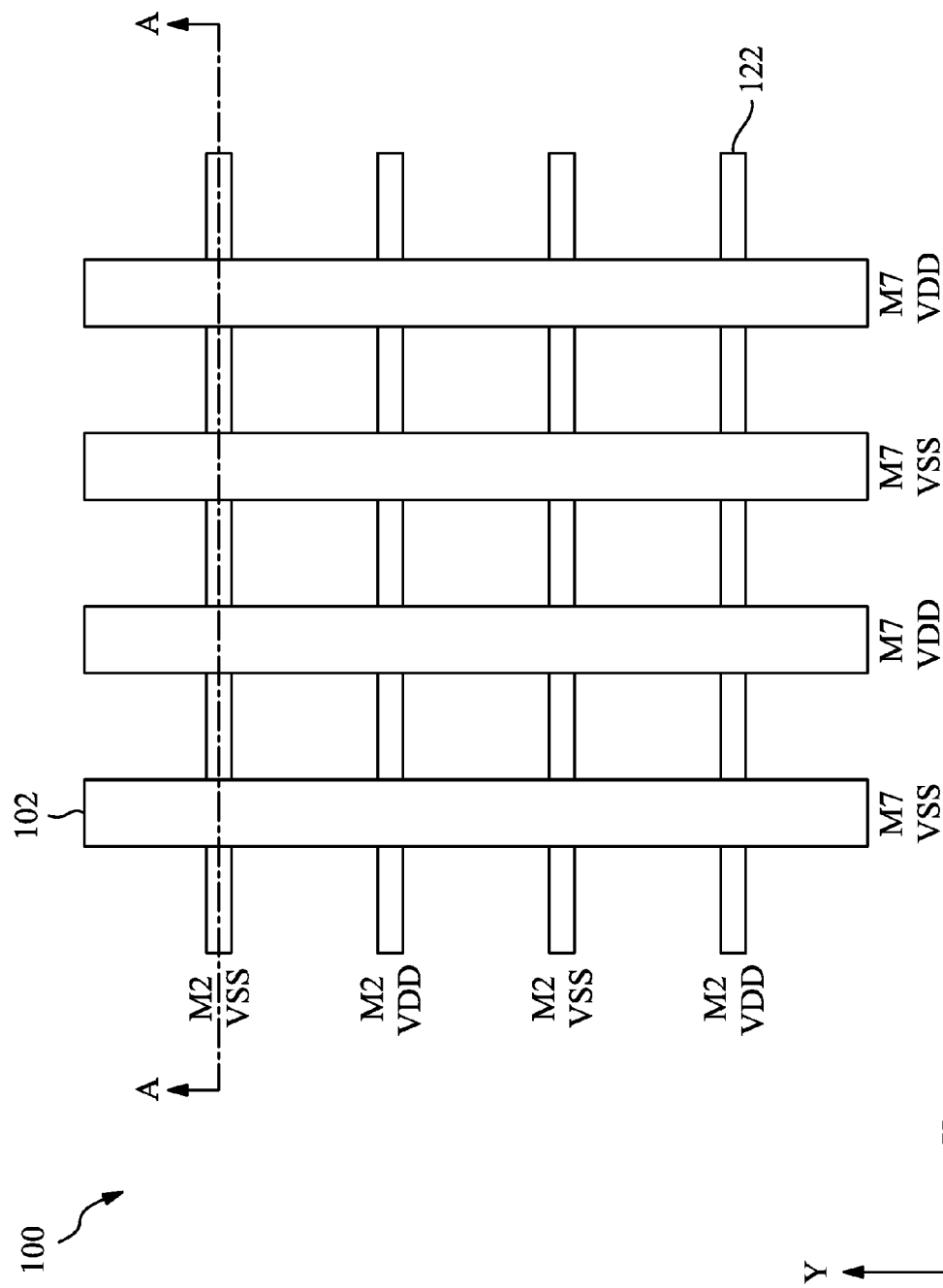
FIG. 1A is a layout diagram illustrating a top-view of a power network, according to some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, it will be understood that when an element is referred to as being "connected to" or "coupled to" another element, it may be directly connected to or coupled to the other element, or one or more intervening elements may be present.

Figure 1B:
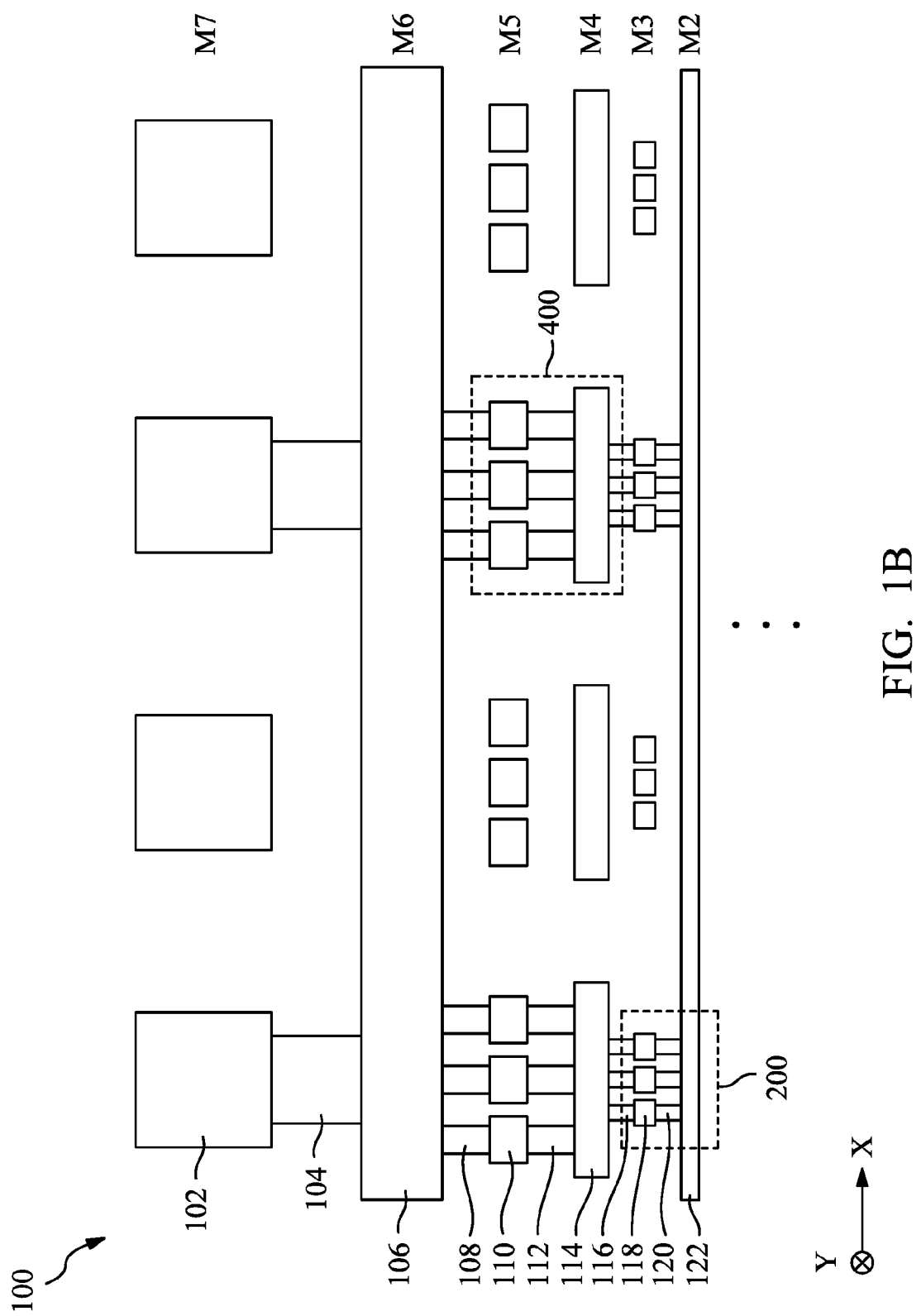
FIG. 1B is a cross-sectional view of the power network of FIG. 1A, taken along line A-A of FIG. 1A, according to some embodiments.

FIG. 1A illustrates a top-view of a layout diagram for a power network 100, in accordance with some embodiments. FIG. 1B provides a cross-sectional side view of the power network 100 of FIG. 1A, taken along line A-A of FIG. 1A. Referring to both FIGS. 1A and 1B, for purposes of discussion and clarity, a subset of conductive layers (M2-M7) is illustrated and discussed herein. It is understood that additional layers, such as a first conductive layer M1 (not shown) or subsequent conductive layers M8, M9, etc. (not shown) may be present in the power network 100. In various embodiments, an IC may include more or less conductive layers than shown in FIGS. 1A and 1B, depending on a particular IC design.

As shown in FIGS. 1A and 1B, the power network 100 includes a plurality of conductive lines 122 in a second conductive layer M2, a plurality of conductive segments 118 in a third conductive layer M3, a plurality of conductive segments 114 in a fourth conductive layer M4, a plurality of conductive segments 110 in a fifth conductive layer M5, a plurality of conductive lines 106 in a sixth conductive layer M6 and a plurality of conductive lines 102 in a seventh conductive layer M7. The power network 100 further includes a plurality of interlayer vias 120 between the conductive layers M2 and M3, a plurality of interlayer vias 116 between the conductive layers M3 and M4, a plurality of interlayer vias 112 between the conductive layers M4 and M5, a plurality of interlayer vias 108 between the conductive layers M5 and M6, and a plurality of interlayer vias 104 between the conductive layers M6 and M7. Each layer M1, M2 . . . or M7 of the power network 100 includes alternatively arranged VDD lines and/or VSS lines as shown in FIG. 1A. The interlayer vias 120,116, 112, 108 and 104 couple corresponding VDD lines in the layers M1-M7, and couple corresponding VSS lines in the layers M1-M7.

Referring to FIG. 1A, in some embodiments, the conductive lines 102 in the conductive layer M7 run in a Y direction. The conductive lines 122 in the conductive layer M2 run in an X direction, which is substantially orthogonal to the Y direction. As shown in FIG. 1A, the conductive lines 102 cross over the conductive lines 122 in a "crisscross" fashion to form a mesh network of power lines, in accordance with some embodiments.

Referring to FIG. 1B, a cross-sectional view of a portion of an exemplary IC reveals a plurality of conductive layers M2-M7 that provide power and signal lines (e.g., pins) for providing power and connectivity for all the devices or cells of the IC. As shown in FIG. 1B, a plurality of conductive lines 102 in the conductive layer M7 run in the Y direction (i.e., perpendicular to the plane of the page), and interlayer vias 104 between the conductive layers M7 and M6 are formed where the conductive lines 102 in the conductive layer M7 overlap with one more conductive lines 106 in the conductive layer M6. Further, in order to connect the conductive lines 106 in the conductive layer M6 to the conductive lines 122 in the conductive layer M2, the conductive segments 110, 114 and 118 in the conductive layers M5, M4 and M3, respectively, and the interlayer vias 108, 112, 116 and 120 between the conductive layers M6 and M5, M5 and M4, M4 and M3, and M3 and M2, respectively, are formed at locations corresponding to where the conductive lines 102 in the conductive layer M7 overlap with the conductive lines 122 in the conductive layer M2. As shown in FIG. 1B, conductive lines or segments in each conductive layer run orthogonally with respect to conductive lines or segments in an adjacent conductive layer to form a mesh network. Thus, the conductive segments 110 in the conductive layer M5 run in the Y direction, while the conductive segments 114 in the conductive layer M4 run in the X direction. The conductive segments 118 in the conductive layer M3 run in the Y direction, while the conductive segment 122 in the conductive layer M1 runs in the X direction.

In FIG. 1B, corresponding to places where the conductive lines 102 overlap with the conductive lines 122, a fishbone structure 200 is formed by a portion of conductive segments 118, the conductive line 122 and a portion of the interlayer vias 120, and a fishbone structure 400 is formed by a portion of conductive segments 110, one of the conductive segments 114 and a portion of the interlayer vias 112. Exemplary methods and systems for creating a fishbone structure for IC power networks are disclosed in U.S. application Ser. No. 14/600,619 titled "Fishbone Structure Enhancing Spacing With Adjacent Conductive Line in Power Network," filed on Jan. 20, 2015, the entirety of which is incorporated by reference herein.

Figure 2:
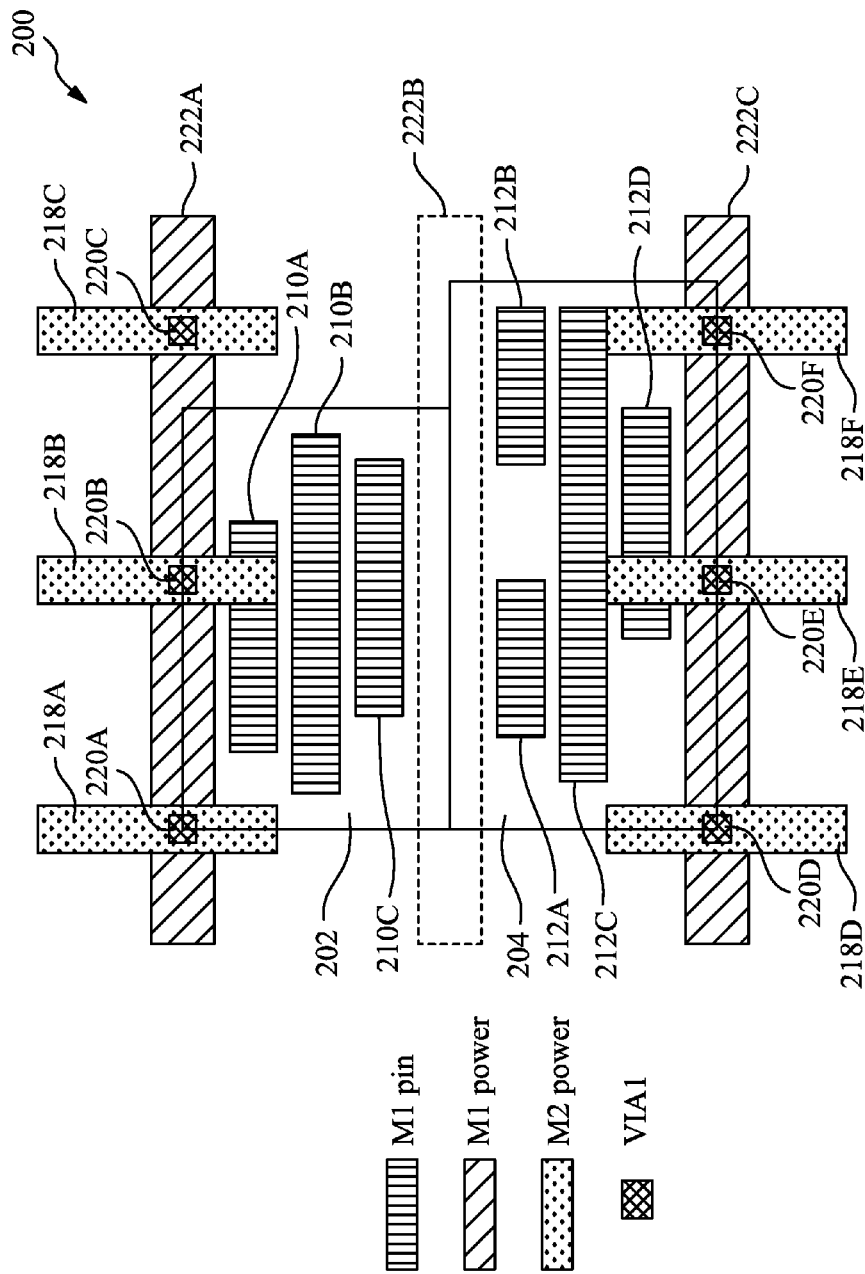
FIG. 2 is a layout diagram illustrating a top view of an IC structure having a fishbone power network and horizontal signal lines, according to some embodiments.

FIG. 2 is a layout diagram illustrating a top view of the fishbone structure 200 of FIG. 1B, in accordance with some embodiments. In FIG. 2, the fishbone structure or power network 200 is illustrated for two adjacent cells 202 and 204. Each cell 202 and 204 includes a plurality of horizontal signal lines (e.g., M1 conductive pins) 210A-210C and 212A-212D, respectively, formed on a first conductive layer M1. These horizontal signal lines provide desired connections between device nodes or structures (not shown) in each respective cell. The fishbone structure 200 further includes a plurality of horizontal power lines 222A and 222C formed on the first conductive layer M1. In some embodiments, a power line 222B (represented by dashed lines) is formed on the first conductive layer M1. In some embodiments, a power line 222B is not formed on the first conductive layer M1 A plurality of vertical power lines 218A-218F are formed on a second conductive layer M2 that lies above the first conductive layer M1. It should be noted that the first and second conductive layers M1 and M2 of FIG. 2 are not necessarily the same conductive layers M1 and M2 discussed above in connection with FIGS. 1A and 1B. Instead, the first and second conductive layers M1 and M2 discussed with reference to FIG. 2, and FIGS. 3A-5B below, may be any two conductive layers in an IC that can provide power lines for one or more cells in the IC, as described herein. For example, the first and the second layers could be any two respective layers M3, M4, M5, M6 and M7 shown in FIG. 1B.

A first horizontal power line 222A serves as a first "spine" of the fishbone power network. A first plurality of vertical power lines 218A, 218B and 218C serve as "ribs" of the fishbone structure and orthogonally cross over the first spine 222A at predetermined locations along the length of the spine 222A. As shown in FIG. 2, the first plurality of ribs 218A, 218B and 218C are electrically coupled to the first spine 222A by corresponding vias 220A, 220B and 220C, respectively. In some embodiments, a second horizontal power line 222B is formed. A third horizontal power line 222C serves as a second spine 222C of the fishbone power network, and a second plurality of vertical power lines 218D, 218E and 218F serve as ribs that cross over and electrical couple to the second spine 222C by means of corresponding vias 220D, 220E and 220F, respectively.

As shown in FIG. 2, the first cell 202 has three horizontally running signal lines (shown as M1 pins in this example) 210A-210C formed on the first conductive layer M1. The second cell 204 has four horizontal signal lines (M1 pins in this example, which are conductive structures that carry signals from inside the cells to outside the cells, or vice versa) 212A-212D also formed on the M1 layer. The M1 pins provide conductive paths between IC device nodes and/or other structures within each cell. As shown in FIG. 2, there is no overlap between any of the M1 pins (210A-210C and 212A-212D) and M1 spines 222A-222C. Thus, there is no conflict (e.g., a "short circuit") between the M1 pins and spines 222A-222C. Although, there is an overlap between vertical M2 power line 218B and horizontal M1 pin 210A, there is no conflict because power line 218B is in the second conductive layer M2 while the horizontal pin 210A is in the first conductive layer M1. Similarly, vertical M2 power line 218E overlaps with horizontal M1 pin 212D, but there is no conflict between power line 218E and pin 212D because they are formed on different conductive layers.

Figure 3A:
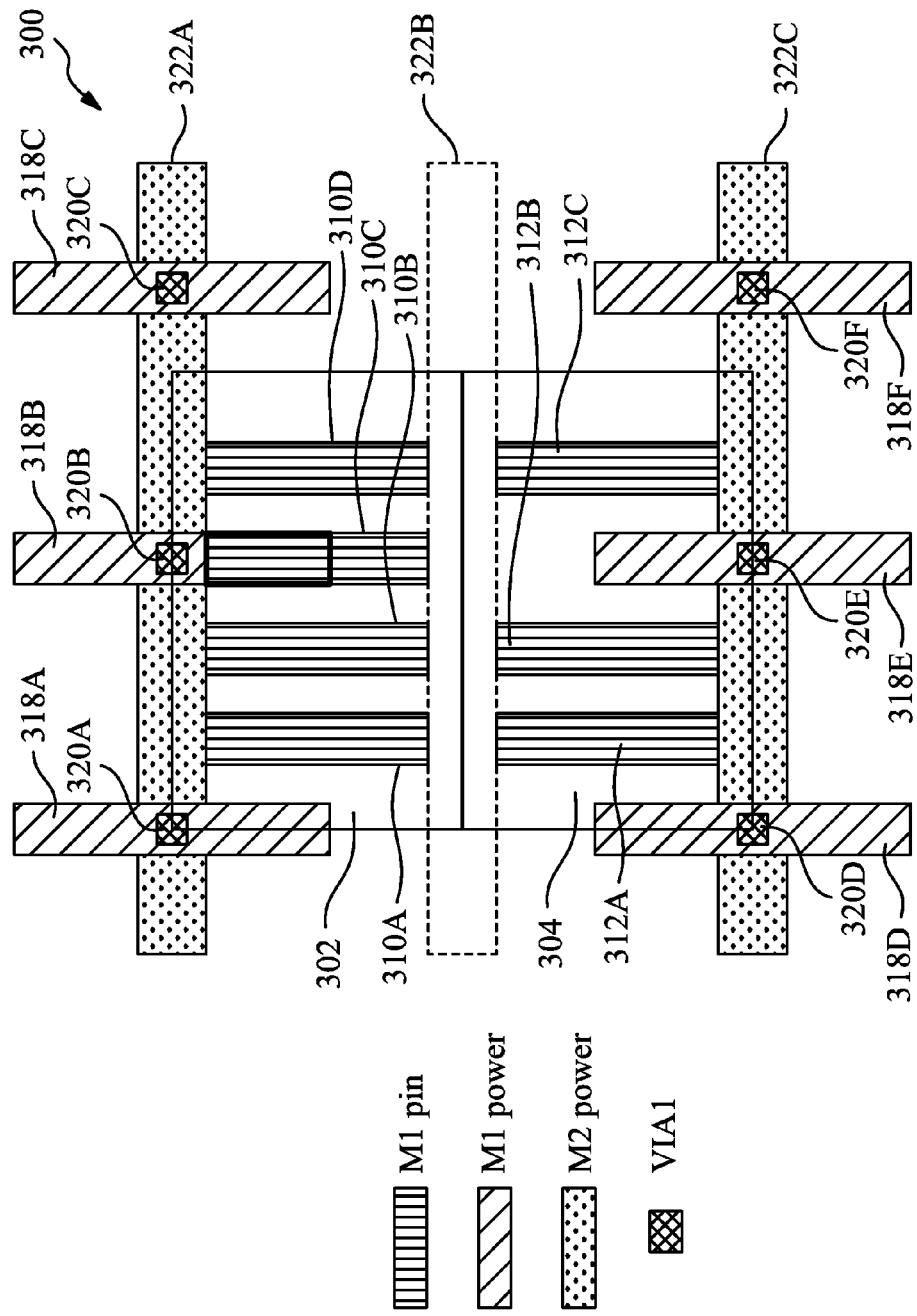
FIG. 3A is a layout diagram illustrating a top view of an IC structure having a fishbone power network and vertical signal lines, according to some embodiments.

As illustrated in FIG. 3A, if a plurality of signal lines (e.g., conductive pins) are formed on the same conductive layer as that of the ribs of a fishbone structure, it is possible that one or more of the signal lines may overlap with one or more of the ribs and cause a conflict (e.g., a short circuit). FIG. 3A is a layout diagram showing a top view of fishbone power network 300 and a plurality of vertical cell pins formed on the same conductive layer as the ribs of the fishbone structure 300, the vertical pins running in the same directions as the ribs, in accordance with some embodiments. If an IC layout is not carefully designed, it is possible that vertical pins of a cell will sometimes conflict with vertical power lines or ribs in the same layer. Thus, care must be taken to avoid such conflicts, which can significantly restrict placement and routing of power lines and signal lines, resulting in an inefficient use of valuable semiconductor "real estate."

As shown in FIG. 3A, a plurality of vertical power lines 318A-318F are formed on a first conductive layer M1 and a plurality of horizontal power lines 322A and 322C are formed on a second conductive layer M2. In some embodiments, an additional horizontal power line 322B, represented by dashed lines, can also be formed on the second conductive layer M2.

The first horizontal power line 322A serves as a first spine 322A of the fishbone power network, while a first set of the vertical power lines 318A, 318B and 318C serve as a first set of ribs 318A-318C of the fishbone power network. The first set of ribs 318A-318C are electrically coupled to the first spine 322A by corresponding vias 320A, 320B and 320C, respectively. A second horizontal power line could be formed at the location represented by dashed line 322B is not connected to any of the ribs in FIG. 3A but can serve as a spine for ribs of cells. A third horizontal power line 322C serves as a second spine 322C of the fishbone structure, and a second set of vertical power lines 318D, 318E and 318F serve as a second set of ribs 318D-318F of the fishbone power network, and are connected to the second spine 322C by corresponding vias 320D, 320E and 320F, respectively.

As shown in FIG. 3A, a first cell 302 has four vertical M1 pins 310A-310D located in a first conductive layer M1. A second cell 304 has three M1 pins 312A-312C located in the first conductive layer M1. In the top view of FIG. 3A, the rib 318B overlaps with the vertical M1 pin 310C, which causes a conflict (e.g., a short circuit) since they are both on the same conductive layer. In order to avoid this conflict, in some embodiments, the ribs coupled to a particular spine can be staggered to avoid conflicts with the pins on the same conductive layer. As used herein, "stagger" or "staggered" means to shift or to offset with respect to a common reference point or reference structure (e.g., a power line). For example, "staggered" ribs refers to two or more ribs that are offset from one another with respect to a common reference point, line or structure (e.g., a spine). Thus, a first rib may be shifted downwardly with respect to a horizontal spine, while a second rib may be shifted upwardly with respect to the spine, to create first and second ribs that are staggered with respect to one another.

Figure 3B:
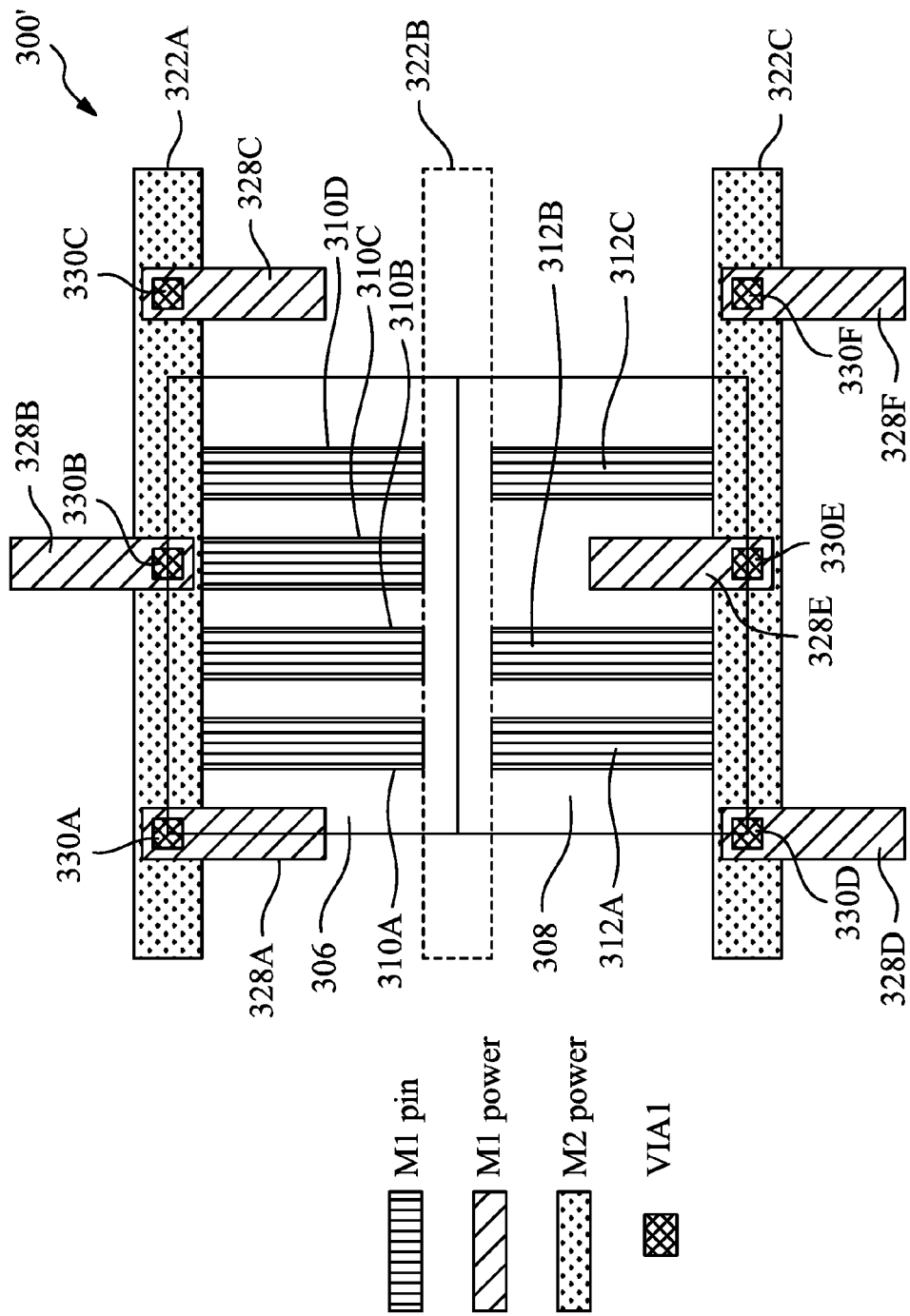
FIG. 3B is a layout diagram illustrating a top view of an IC structure having a staggered fishbone power network and vertical signal lines, according to some embodiments.

FIG. 3B is an exemplary layout diagram illustrating a top view of an IC structure 300' having a staggered fishbone power network and vertical cell pins, in accordance with some embodiments. As shown in FIG. 3B, the structure 300' includes the same spines 322A and 322C discussed above. As discussed above with respect to FIG. 3A, the horizontal power line 322B can also be formed on the second conductive layer M2. However, a first set of the vertical power lines 328A, 328B and 328C formed on the first conductive layer M1 are staggered with respect to one another to provide staggered ribs of the staggered fishbone power network. Each of the staggered ribs 328A, 328B and 328C are electrically coupled to the first spine 322A by corresponding vias, 330A, 330B and 330C, respectively. A second set of staggered vertical power lines 328D, 328E and 328F serve as a second set of staggered ribs of the staggered fishbone power network, and are connected to the second spine 322C by corresponding vias 330D, 330E and 330F, respectively.

As shown in FIG. 3B, a first cell 306 has four vertical M1 pins 314A-314D located in a first conductive layer M1. A second cell 308 has three M1 pins 316A-316C located in the first conductive layer M1. The rib 328B of the first spine 322A is staggered upward to avoid conflict with pin 314C of the first cell 306. The ribs 328A and 328C of the first spine 322A are staggered downward, in accordance with one embodiment. The rib 328E of the second spine 322C is also staggered upward in the same direction as the rib 328B of the first spine 322A. The ribs 328D and 328F of the second spine 322C are staggered downward, in the same direction as the ribs 328A and 328C of the first spine 322A. Thus, the vertical rib 328B does not conflict with the vertical M1 pin 314C of the cell 306. Furthermore, the vertical rib 328E does not conflict with any of the vertical M1 pins of the cell 308.

As illustrated in FIG. 3B, staggering vertically-oriented ribs in a fishbone power network to avoid vertically-oriented signal lines (e.g., pins) formed on the same conductive layer can significantly free up available placement sites on the integrated circuit by providing many more options for IC power network design. For example, the space between spine 322A and spine 322B, and between the ribs 328A and 328C would not have been able to accommodate cell 306 if the rib 328B were not staggered upward to leave space for M1 pin 310C. As a result, the site would have been wasted and an additional site would be needed to accommodate cell 306. Additionally, it is appreciated that staggering the ribs of a power network can improve chip performance by reducing the length of conductive lines that must be routed to each cell, since cells can be placed closer together in an IC layout design. For the same example presented above, if the rib 328B were not staggered upward to accommodate cell 306, then cell 306 could not have been located adjacent to the cell 308. As a result, additional conductive lines would have been required for routing signals between cells 306 and 308. Furthermore, since cells having staggered fishbone power networks can increase the area utilization ratio of an IC chip, compared to IC chips utilizing conventional cells having more limited placement options, IC chip sizes can be decreased and/or more devices can be placed in a given chip area. As a result, chip costs can be decreased by enabling chip designs in smaller areas or enabling a larger number of devices to be placed in a given chip area.

Figure 3C:
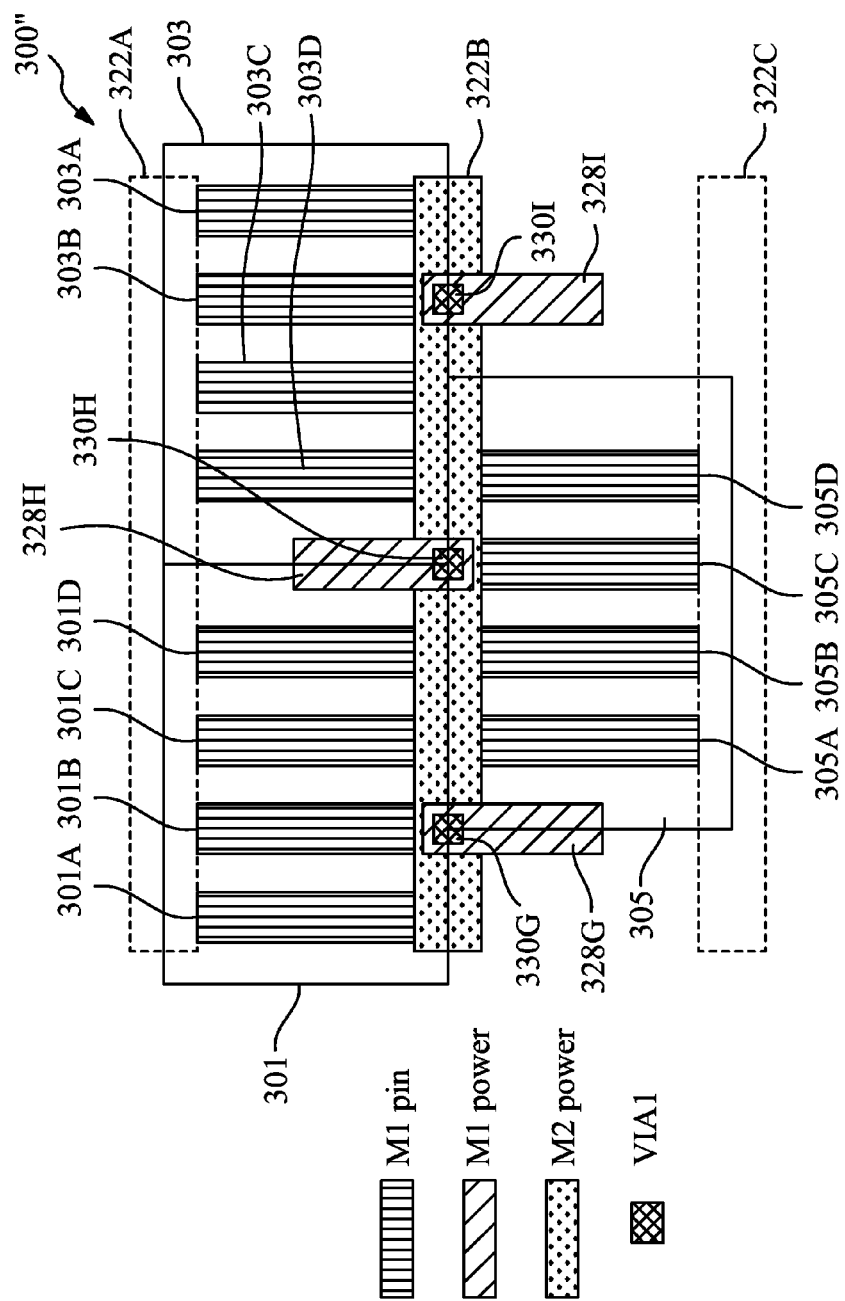
FIG. 3C is a layout diagram illustrating a top view of an IC structure having a staggered fishbone power network and vertical signal lines, according to some embodiments.

FIG. 3C is a layout diagram illustrating a top view of an IC structure 300" having a staggered fishbone power network and vertical cell pins, according to some embodiments. The structure 300" includes horizontal power line 322B and power lines 322A and 322C. Power line 322B is formed on a second conductive layer M2 as discussed above with respect to FIG. 3A. Power lines 322A and 322C can also be formed on the second conductive layer M2, in accordance with some embodiments. A single set of vertical power lines 328G-328I are formed on a first conductive layer M1 and are staggered to serve as staggered ribs 328G-328I that are electrically coupled to the spine 322B by corresponding vias, 330G, 330H and 330I, respectively. Horizontal power line 322A and 332C are not connected to any of the ribs in FIG. 3C but can serve as a spine for ribs, or staggered ribs, of cells.

As shown in FIG. 3C, a first cell 301 has four vertical M1 pins 301A-301D located in a first conductive layer M1. A second cell 303 has four M1 pins 303A-303D located in the first conductive layer M1. A third cell 305 has four M1 pins 305A-305D located in the first conductive layer M1. The rib 328H of the spine 322B is staggered upward to avoid conflict with pin 305E of cell 305. The ribs 328G and 328I of the spine 322B are staggered downward to avoid conflict with pins 301B and 303B, respectively. Thus, by staggering ribs 328G, 328H and 328I as shown, it is possible to avoid conflicts with multiple vertical pins in adjacent cells, thereby providing an increased number of options for cell layout designs, and increasing utilization of valuable IC chip real estate. For example, when the ribs 328G and 328I are staggered downward, and when the rib 328H is staggered upward, as illustrated in FIG. 3C, the area occupied by cell 301 can also accommodate other type of cells, such as a cell with three pins whose locations may be selected from any three locations out of the four pin locations of cell 301. Similarly, the area occupied by cell 301 can also accommodate cells with two pins or one pin, whose locations may be selected from any two, or one, pin location(s) out of the four pin locations of cell 301 illustrated in FIG. 3C. Similar options for accommodating various types of cells are provided by the areas occupied by cells 303 and 305.

Figure 4A:
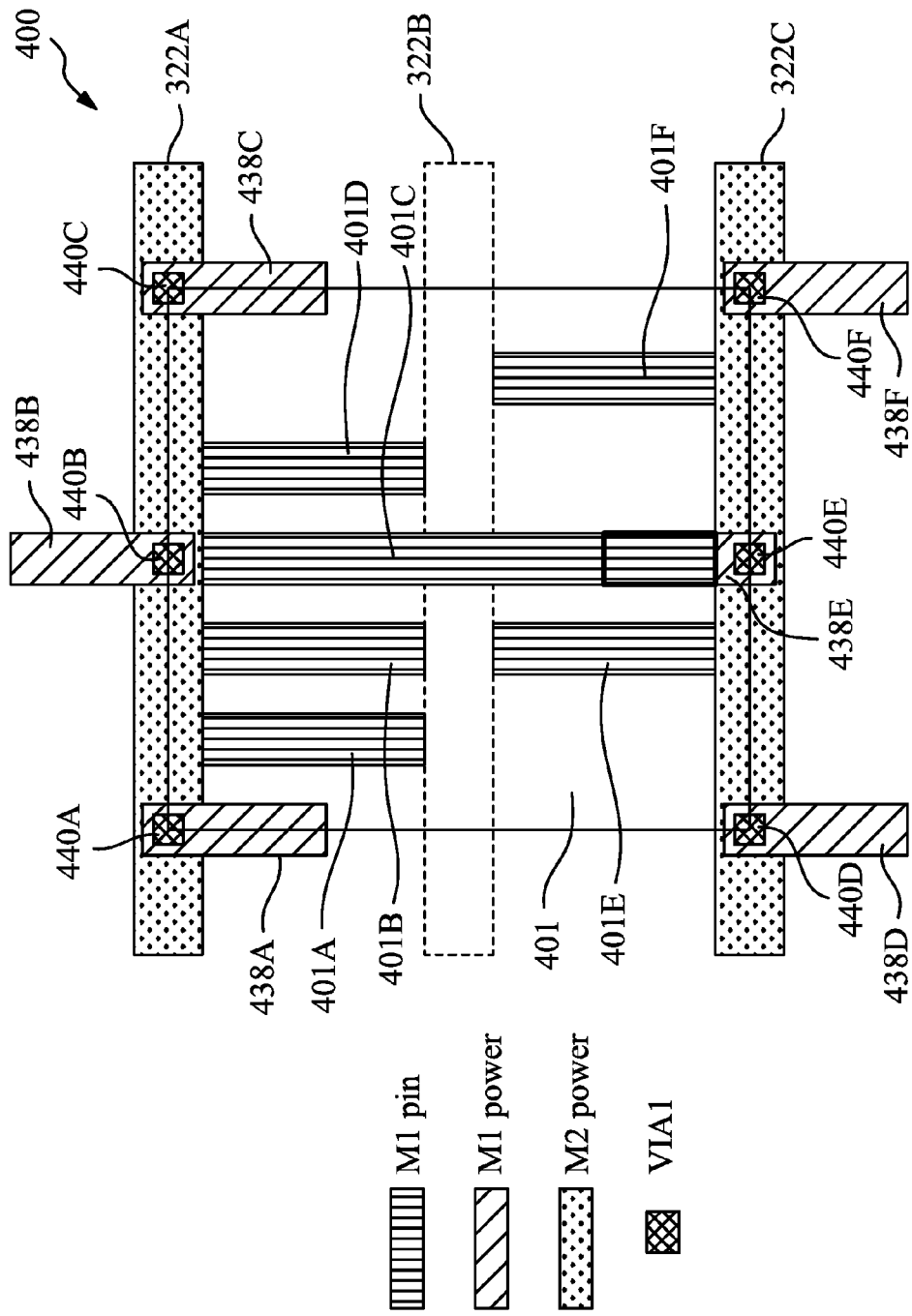
FIG. 4A is a layout diagram illustrating a top view of an IC structure having a staggered fishbone power network and vertical signal lines, according to some embodiments.

FIG. 4A is a layout diagram illustrating a top view of an IC structure 400 having a staggered fishbone power network and vertical cell pins, according to some embodiments. The structure 400 includes the same horizontal power lines 322A and 322C formed on a second conductive layer M2, as discussed above, and a plurality of vertical power lines 438A-438F, formed on a first conductive layer M1. A horizontal power line 322B can also be formed on the second conductive layer M2. A first set of the vertical power lines 438A, 438B and 438C are staggered to serve as a first set of staggered ribs 438A-438C of the staggered fishbone power network, each rib being electrically coupled to the first spine 322A by corresponding vias, 440A, 440B and 440C, respectively.

As shown in FIG. 4A, the cell 401 spans the distance between spine 322A and spine 322C and in this regard has a height that is twice that of cell 301. The cell 401 includes five regular length vertical M1 pins 410A, 401B, 401D and 401E and 401F located in a first conductive layer M1. The cell 401 also has a double-length vertical M1 pin 401C that substantially traverses the entire space between the first spine 442A and the third spine 442C. The rib 438B of the first spine 322A is staggered upward to avoid conflict with the double length vertical pin 401C of the cell 401. The ribs 438A and 438C of the first spine 322A are staggered downward. In this embodiment, the staggered fishbone structure provided by the third spine 322C and plurality of vertical ribs 438D, 438E and 438F is identical in orientation to the staggered fishbone structure comprising the first spine 322A, located at the top of the cell 401. In this case, however, it is seen that the rib 438E of the second spine 322C conflicts with double length vertical M1 pin 401C of cell 401. Thus, the structure 400 of FIG. 4A should be modified to avoid this conflict.

Figure 4B:
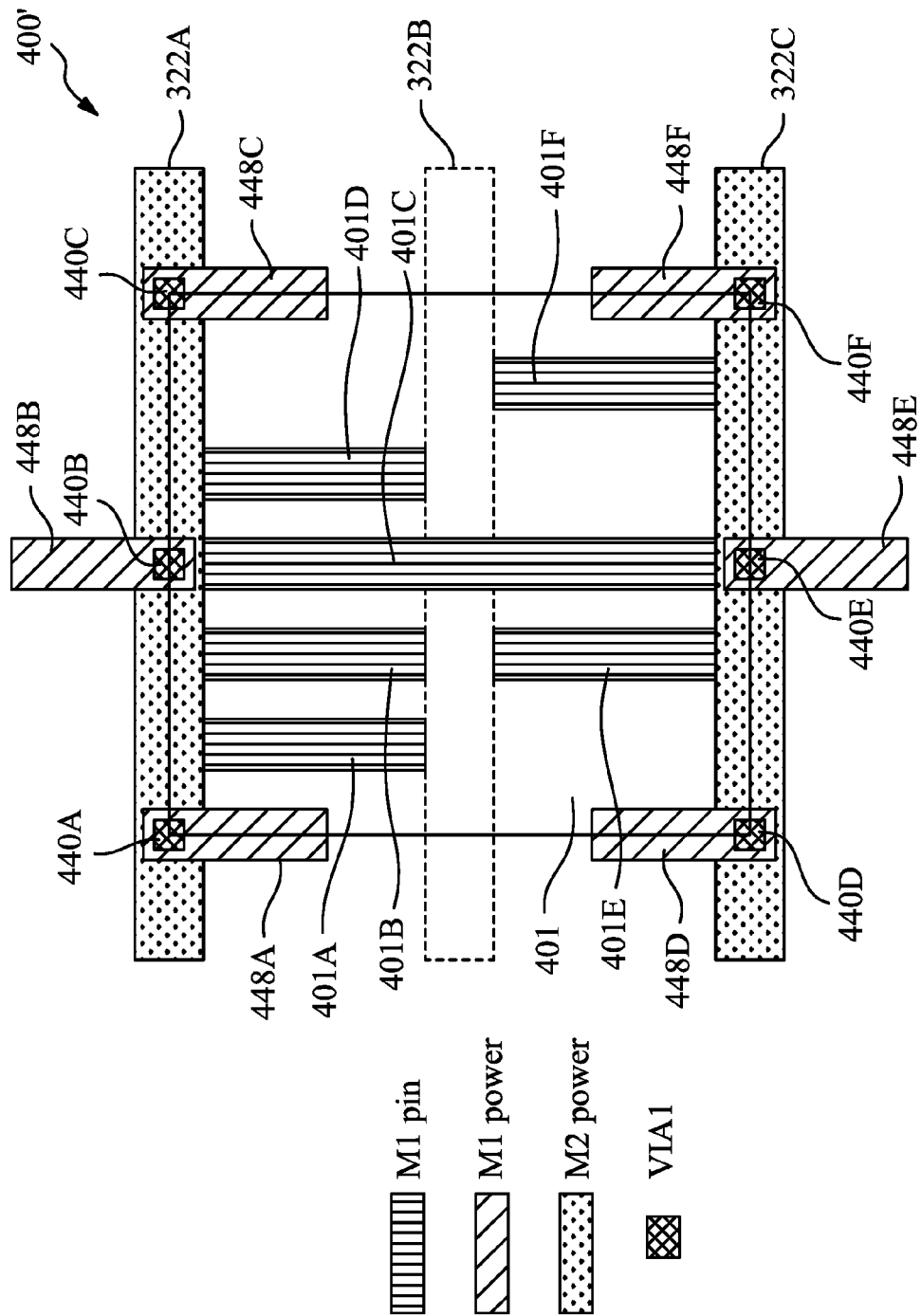
FIG. 4B is a layout diagram illustrating a top view of an IC structure having a staggered fishbone power network and vertical signal lines, according to some embodiments.

FIG. 4B is a layout diagram illustrating a top view of a structure 400', which is a modified version of the structure 400 of FIG. 4A, according to some embodiments. The structure 400' includes the same horizontal power lines 322A and 322C formed on a second conductive layer M2, as discussed above. Similar to FIG. 4A, a power line 322B can be formed on the second conductive layer M2 in some embodiments. A plurality of vertical power lines 448A-448F are formed on a first conductive layer M1. A first set of the vertical power lines 448A, 448B and 448C are staggered to serve as a first set of staggered ribs 448A-448C of the staggered fishbone power network, each rib being electrically coupled to the first spine 322A by corresponding vias, 450A, 450B and 450C, respectively. A second set of vertical power lines 448D, 448E and 448F serve as a second set of staggered ribs 448D-448F of the staggered fishbone power network, and are connected to the second spine 322C by corresponding vias 450D, 450E and 450F, respectively.

As shown in FIG. 4B, the double height cell 401 has five vertical M1 pins 401A-401E and a double length M1 pin 401F located in a first conductive layer M1. The rib 448B of the first spine 322A is staggered upward to avoid conflict with pin 401C of cell 401. The ribs 448A and 448C of the first spine 322A are staggered downwardly since there are no conflicting pins in that direction. The rib 448E of the second spine 322C is staggered downward in the opposite direction of the rib 448B of the first spine 322A. The ribs 448D and 448F of the second spine 322C are staggered upward, in the opposite direction of the ribs 450A and 450C of the first spine 322A. Thus, the second staggered fishbone structure comprising the second spine 322C and ribs 448D, 448E and 448F is the mirror opposite of the first staggered fishbone structure comprising the first spine 322A and ribs 448A, 448B and 448C. By implementing the second fishbone structure as a mirror opposite, as shown in FIG. 4B, the vertical M1 power line 448E no longer conflicts with the vertical M1 pin 401C of cell 401. It is appreciated that when an IC layout and power network is being designed, providing different options for staggering the ribs for a particular cell increases the number of design options and allow designers to place different types of cells adjacent to one another. For example, instead of staggering the rib 448E upward, the rib 448E can be staggered downward to accommodate M1 pin 401C, which would not have been accommodated if the rib 448E is not staggered. Furthermore, each cell can have a staggered fishbone power network that may the same or different in configuration from that of an adjacent cell. This increased number of design options allows designers to utilize chip space more efficiently and, thus, reduce overall chip size and costs.

Figure 5A:
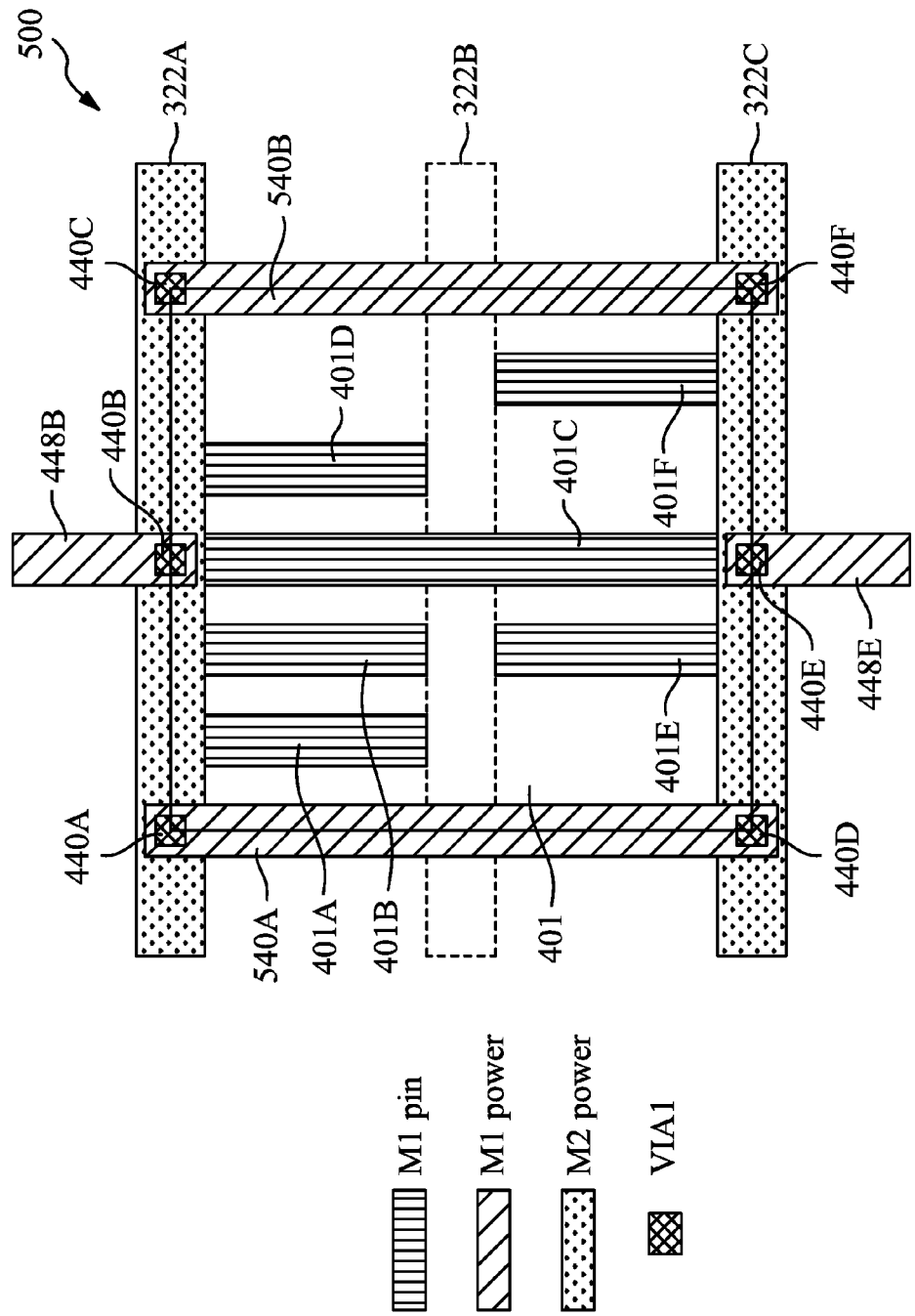
FIG. 5A is a layout diagram illustrating a top view of an IC structure having a staggered fishbone power network and vertical signal lines, according to some embodiments.

FIG. 5A is a layout diagram illustrating a top view of an IC structure 500 having a staggered fishbone power network and vertical cell pins, according to some embodiments. The IC structure includes the same double-cell height cell 401 having the same M1 pins 401A-401F, as discussed above with respect to FIG. 4B. Additionally, the structure 500 includes the same horizontal power lines 322A and 322C formed on a second conductive layer M2, and the same staggered ribs 448B and 448E, as discussed above. Similar to FIG. 4A, a power line 322B can be formed on the second conductive layer M2, in some embodiments. Therefore, common elements previously described above with respect to FIG. 4B will not be described again. The structure 500, however, replaces ribs 448A and 448D with a single rib 540A that spans across the entire distance between spine 322A and spine 322C, with respective ends being electrically coupled to the first spine and second spines 322A and 322C, by corresponding vias 440A and 440D, respectively. Similarly, a single rib 540B replaces the ribs 448C and 448F of FIG. 4B. The single rib 540B spans across the entire distance between spine 322A and spine 322C, with respective ends being electrically coupled to the first spine and second spines 322A and 322C, by corresponding vias 440C and 440F, respectively. Thus, ribs 540A and 540B are common ribs shared by the first and second spines 322A and 322C and do not conflict with any pins in the cell 401, in accordance with some embodiments. Ribs 448B and 448E are non-common ribs because they are not shared by any spines. Due to the resistance of the interconnects forming a power network, there is a voltage drop across the network. The increased length of ribs 540A and 540B reduces overall resistance of the power network by reducing the number of interconnects in the power network, thus improving the overall performance of the IC. For example, additional interconnects are not needed to connect 540A and 540B with 322B. In comparison, if the length of 540A and 540B are shortened by half, for example, then additional interconnects are needed to connect 540A and 540B with 322B, which increase the overall resistance of the power network.

Figure 5B:
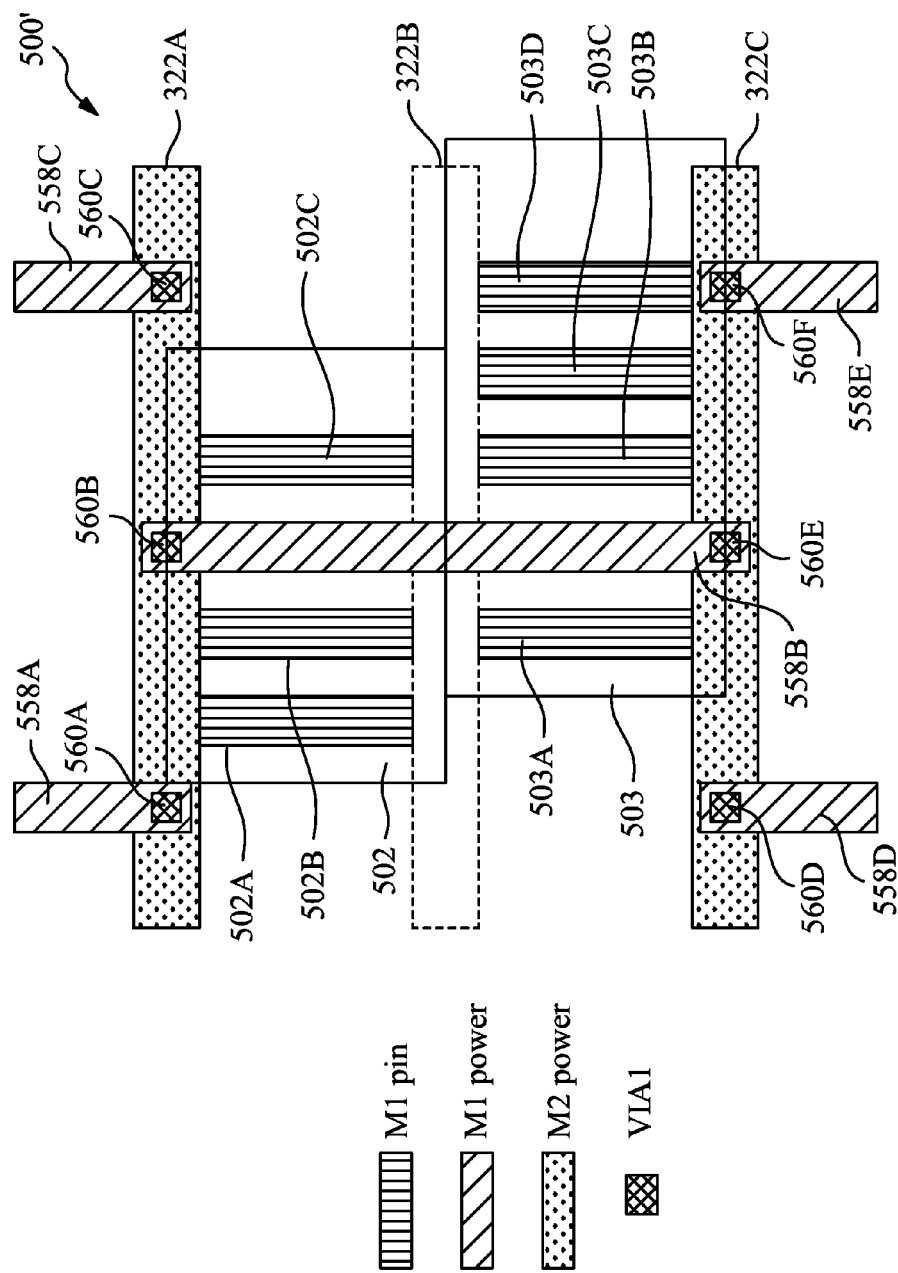
FIG. 5B is a layout diagram illustrating a top view of an IC structure having a staggered fishbone power network and vertical signal lines, according to some embodiments.

FIG. 5B is a layout diagram illustrating a top view of an IC structure 500' having a staggered fishbone power network and vertical cell pins, in accordance with some embodiments. The structure 500' includes the same horizontal power lines 322A and 322C formed on a second conductive layer M2, as discussed above, and a plurality of vertical power lines 558A-558E formed on a first conductive layer M1. Similar to FIG. 4A, power line 322B can be formed on the second conductive layer M2 in some embodiments. A first set of the vertical power lines 558A, 558B and 558C are staggered to serve as a first set of staggered ribs of the staggered fishbone power network that are electrically coupled to the first spine 322A by corresponding vias, 560A, 560B and 560C, respectively. A second set of vertical power lines 558D, 558B and 558E serve as a second set of staggered ribs of the staggered fishbone power network, connected to the second spine 322C by corresponding vias 560D, 560E and 560F, respectively. The staggered rib 558B is a double length power line that is electrically connected to both the first spine 322A and the third spine 322C at respective ends of the rib 558B by respective vias 560B and 560E. Thus, the staggered rib 558B is a member of both the first and second sets of staggered ribs discussed above. In other words, the rib 558B is a common rib shared by and connected to both spines 322A and 322C. The ribs 558A, 558C, 558D and 558E are non-common ribs because they are not shared by two or more spines.

As shown in FIG. 5B, a first cell 502 has three vertical M1 pins 502A-502C located in a first conductive layer M1. A second cell 503 has four M1 pins 503A-503D located in the first conductive layer M1. The ribs 558A and 558C of the first spine 322A are staggered upward The ribs 558D and 558E of the second spine 322C are staggered downward, in the opposite direction of ribs 558A and 558C of the first spine 322A. The rib 558B is a double length rib that spans the distance between the first and second spines 322A and 322C, respectively, and is electrically connected to the first and second spines at respective opposite ends of the rib 558B by corresponding vias 560B and 560E, respectively. As shown in FIG. 5B, no conflicts exist between any of the M1 conductive lines and any of M1 staggered ribs. Additionally, the double length power line or rib 558B provides improved IR drop characteristics for the power network.

In some embodiments, an IC fabrication process includes generating any one of the exemplary IC structures illustrated in FIGS. 3B, 3C, 4B, 5A and 5B, for example, by sequentially forming each of the features (e.g., spines, ribs, vias, pins, conductive layers, etc.) in an appropriate sequence as would be understood by persons of ordinary skill in the art.

Figure 6:
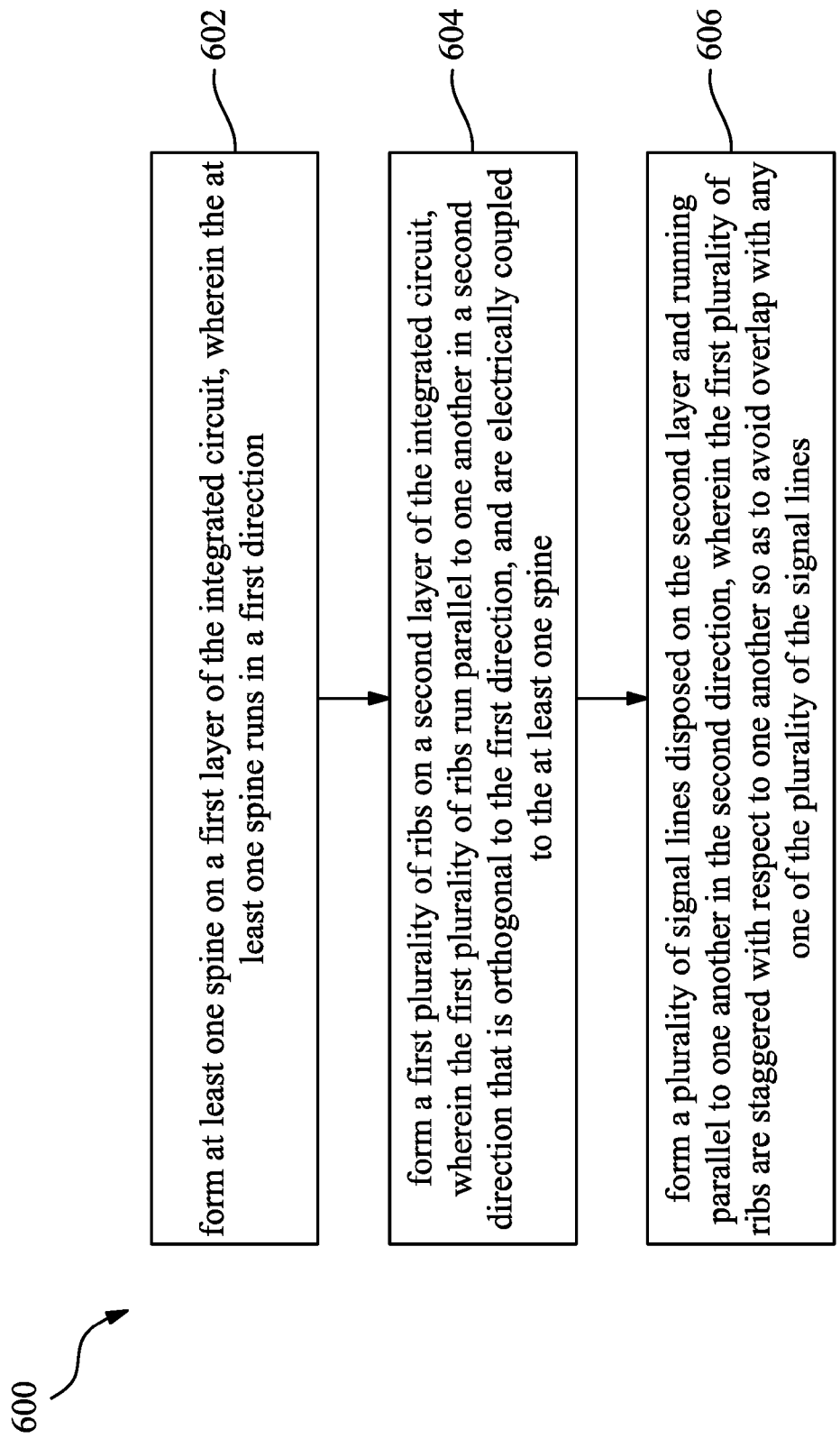
FIG. 6 is a flow chart illustrating a method of creating an IC structure having a staggered fishbone power network, according to some embodiments.

FIG. 6 is a flow chart of an exemplary process 600 for creating an integrated circuit having a staggered fishbone power network, in accordance with some embodiments. The process 600 includes, at step 602, forming at least one spine on a first layer of the integrated circuit, wherein the at least one spine runs in a first direction. At step 604, the process includes forming a first plurality of ribs on a second layer of the integrated circuit, wherein the first plurality of ribs run parallel to one another in a second direction that is orthogonal to the first direction, and are electrically coupled to the at least one spine. At step 606, the process includes forming a plurality of signal lines disposed on the second layer and running parallel to one another in the second direction, wherein the first plurality of ribs are staggered with respect to one another so as to avoid overlap with any one of the plurality of the signal lines.

Figure 7:
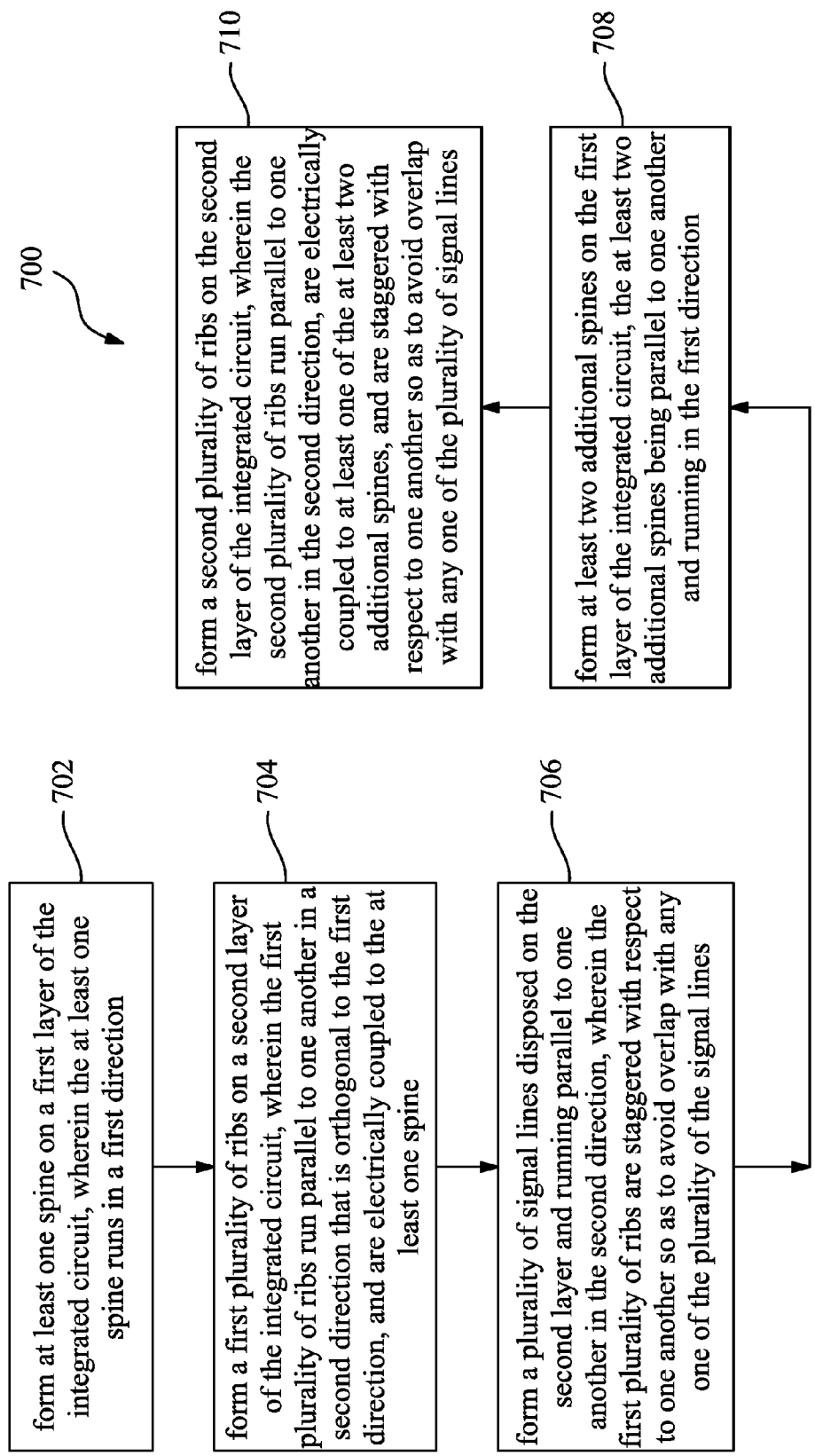
FIG. 7 is a flow chart illustrating a method of creating an IC structure having a staggered fishbone power network, according to some embodiments.

FIG. 7 is a flow chart of a process 700 for creating an integrated circuit having a staggered fishbone power network, in accordance with some embodiments. Steps 702, 704 and 706 are similar to steps 602, 604 and 606 discussed above and, therefore, are not described again here. At step 708, the process further includes forming at least two additional spines on the first layer of the integrated circuit, the at least two additional spines being parallel to one another and running in the first direction. At step 710, the process includes forming a second plurality of ribs on the second layer of the integrated circuit, wherein the second plurality of ribs run parallel to one another in the second direction, are electrically coupled to at least one of the at least two additional spines, and are staggered with respect to one another so as to avoid overlap with any one of the plurality of signal lines.

Figure 8:
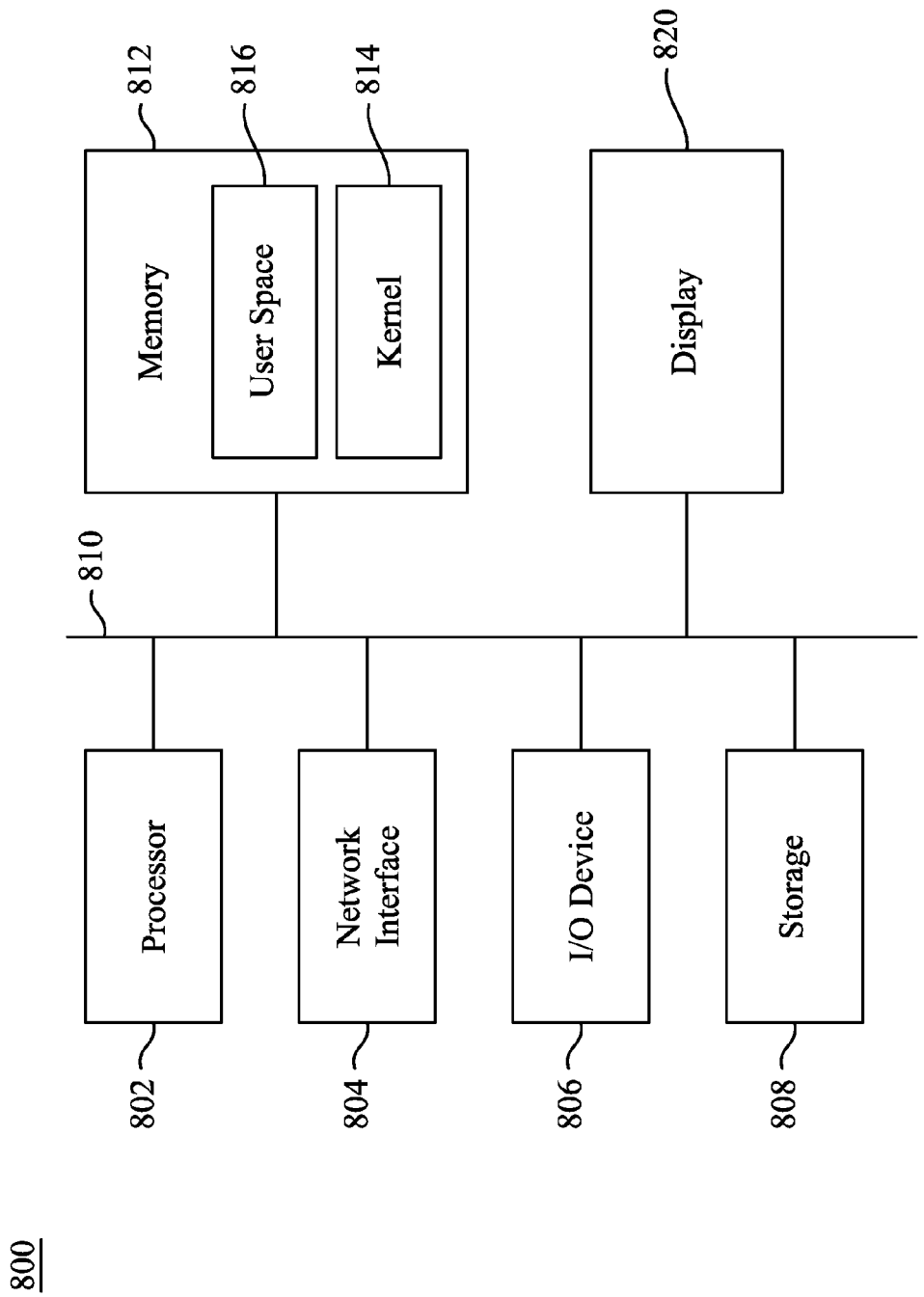
FIG. 8 is a block diagram of a computer system that can used to create a layout design of an IC structure having a staggered fishbone power network, according to some embodiments.

In various embodiments, the exemplary IC structures illustrated and described herein can be created graphically as part of an IC layout design process that is performed on a computer system. FIG. 8 illustrates a block diagram of an exemplary computer system 800 for implementing such embodiments of the present disclosure. As shown in FIG. 8, the system 800 includes at least one processor 802, a network interface 804, an input and output (I/O) device 806, a storage medium 808, a bus 810, a memory 812 and a display 820. The bus 810 couples the network interface 804, the I/O device 806, the storage device 808, the memory 812 and the display 820 to the at least one processor 802.

It is appreciated that the at least one processor 802 can be implemented in accordance with various technologies. For example, the at least one processor 802 may include one or more central processing units (CPU's), microprocessors, microcontrollers, controllers, application specific integrated circuits (ASICs), digital signal processors, programmable logic devices, field programmable gate arrays, or any combination of these devices or structures. Furthermore, the storage medium 808 can provide a non-transitory computer-readable medium that stores instructions and/or application programs that are executed by the at least one processor 802 and data used by the application programs to perform one or more functions/processes described herein, such as processes 600 and 700 of FIGS. 6 and 7, respectively, and processes for creating layouts for any of the structures described herein. The storage medium 808 can be implemented using one or more various types of data storage technologies such as, for example, non-volatile memory, volatile memory, random-access memory (RAM), dynamic random-access memory (DRAM), static random-access memory (SRAM), non-volatile RAM (flash memory), read-only memory (ROM), programmable read-only memory (PROM), electrically erasable programmable read-only memory (EEPROM), among others. In various embodiments, the storage medium 808 can be an optical and/or magnetic storage medium and/or a hard disk drive.

In some embodiments, the memory 812 comprises a random access memory (RAM) and/or other volatile storage device and/or read only memory (ROM) and/or other non-volatile storage device. The memory 812 includes a kernel 814 and user space 816, configured to store program instructions to be executed by the processor 802 and data accessed by the program instructions. In some embodiments, the network interface 804 is configured to access program instructions and data accessed by the program instructions stored remotely through a network. The I/O device 806 includes an input device and an output device configured for enabling user interaction with the system 800. The input device comprises, for example, a keyboard, a mouse, etc. The output device comprises, for example, a display, a printer, etc.

In some embodiments, when executing the program instructions, the at least one processor 802 is configured to perform a method of IC layout design that graphically creates on the display 820 the structures illustrated in FIGS. 3B-5B, for example. In further embodiments, the at least one processor 802 executes program instructions stored in memory 812 for performing the processes 600 and 700 of FIGS. 6 and 7.

As described herein, various embodiments of IC structures having a staggered fishbone power network are disclosed, including methods of designing same. It will be evident to those of ordinary skill in the art that the various exemplary embodiments described herein provide various features and advantages. For example, various embodiments improve or enhance IC chip design processes by allowing more variability in design and providing an increased number of options for placing structures such as signal lines/pins and power lines/segments, thereby more effectively utilizing valuable IC chip "real estate." In further embodiments, the performance of IC chips can be improved by reducing the routing length introduced by unnecessary cell displacement associated with conventional designs. Further advantages include a decrease in chip area by increasing the utilization ratio in cell areas, which offered limited structure placement options in conventional designs. Since various embodiments utilize chip real estate more efficiently, chip designs in accordance with various embodiments herein require a smaller area and, hence, decrease chip costs.

In some embodiments, an integrated circuit, includes a first spine formed on a first conductive layer of the integrated circuit, wherein the spine runs in a first direction, and a first plurality of ribs formed on a second conductive layer of the integrated circuit, wherein the first plurality of ribs run parallel to one another in a second direction that is orthogonal to the first direction and overlap respective portions of the first spine. The integrated circuit further includes a first plurality of interlayer vias formed between the first and second conductive layers, wherein each of the plurality of interlayer vias electrically couple respective ones of the first plurality of ribs to the first spine at the respective portions of overlap. A plurality of signal lines are formed on the second conductive layer, running parallel to one another in the second direction, wherein each of the first plurality of ribs are staggered with respect to the first spine so as to avoid a conflict with any one of the plurality of the signal lines, and wherein the first spine and the first plurality of ribs form at least a first portion of a power network that supplies power to the integrated circuit.

In further embodiments, the integrated circuit further includes a second spine formed on the first conductive layer and running parallel to the first spine, and a second plurality of ribs formed on the second conductive layer and running parallel to one another in the second direction so as to orthogonally overlap respective portions of the second spine. The integrated circuit further includes a second plurality of interlayer vias formed between the first and second conductive layers, wherein each of the second plurality of interlayer vias electrically couple respective ones of the second plurality of ribs to the second spine at the respective portions of overlap. A third spine formed on the first conductive layer is disposed between and runs parallel to the first and second spines, wherein each of the second plurality of ribs are staggered with respect to the second spine so as to avoid a conflict with any one of the plurality of the signal lines, and wherein the second spine and the second plurality of ribs form at least a second portion of the power network.

In some embodiments, a method of creating an integrated circuit structure having a power network is disclosed. The method includes forming a first spine on a first conductive layer, wherein the at least one spine runs in a first direction, and forming a first plurality of ribs on a second conductive layer, wherein the first plurality of ribs run parallel to one another in a second direction that is orthogonal to the first direction. The method further includes electrically coupling the first plurality of ribs to the first spine, and forming a plurality of signal lines disposed on the second layer and running parallel to one another in the second direction, wherein the first plurality of ribs are staggered with respect to one another so as to avoid overlap with any one of the plurality of the signal lines.

In further embodiments, the method further includes forming a second spine on the first conductive layer, the second spine running parallel to the first spine, and forming a second plurality of ribs on the second conductive layer, the second plurality of ribs running parallel to one another in the second direction so as to overlap respective portions of the second spine. The method also includes electrically coupling the second plurality of ribs to the second spine, and forming a third spine on the first conductive layer, the third spine being disposed between and running parallel to the first and second spines, wherein each of the second plurality of ribs are staggered with respect to the second spine so as to avoid a conflict with any one of the plurality of the signal lines.

Alternative embodiments provide a non-transitory computer readable medium storing computer executable instructions that when executed perform a method of creating an integrated circuit structure having a power network. The method includes forming a first spine on a first conductive layer, wherein the at least one spine runs in a first direction, and forming a first plurality of ribs on a second conductive layer, wherein the first plurality of ribs run parallel to one another in a second direction that is orthogonal to the first direction. The method further includes electrically coupling the first plurality of ribs to the first spine, and forming a plurality of signal lines disposed on the second layer and running parallel to one another in the second direction, wherein the first plurality of ribs are staggered with respect to one another so as to avoid overlap with any one of the plurality of the signal lines.

In a further embodiment, the non-transitory computer readable medium further stores computer-executable instructions that when executed facilitate forming a second spine on the first conductive layer, the second spine running parallel to the first spine, and forming a second plurality of ribs on the second conductive layer, the second plurality of ribs running parallel to one another in the second direction so as to overlap respective portions of the second spine. The computer-executable instructions further facilitate electrically coupling the second plurality of ribs to the second spine, and forming a third spine on the first conductive layer, the third spine being disposed between and running parallel to the first and second spines, wherein each of the second plurality of ribs are staggered with respect to the second spine so as to avoid a conflict with any one of the plurality of the signal lines.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a first spine formed on a first conductive layer of the integrated circuit, wherein the spine runs along a first axis;
a first plurality of ribs formed on a second conductive layer of the integrated circuit, wherein the first plurality of ribs run parallel to one another along a second axis that is orthogonal to the first axis and overlap respective portions of the first spine, wherein the first plurality of ribs comprises first, second and third ribs spatially staggered from one another so that the first and third ribs each extends from the first spine toward a first direction of the second axis, and the second rib, located between the first and third ribs, extends from the first spine toward a second direction of the second axis opposite the first direction;
a first plurality of interlayer vias formed between the first and second conductive layers, wherein each of the plurality of interlayer vias electrically couple respective ones of the first plurality of ribs to the first spine at the respective portions of overlap; and
a plurality of signal lines running parallel to one another along the second axis and formed within an area between the first and third ribs so as to avoid a conflict with any one of the first plurality of ribs,
wherein the first spine and the first plurality of ribs form at least a first portion of a power network that supplies power to the integrated circuit.

2. The integrated circuit of claim 1, further comprising:
a second spine formed on the first conductive layer and running parallel to the first spine;
a second plurality of ribs formed on the second conductive layer and running parallel to one another along the second axis so as to orthogonally overlap respective portions of the second spine;
a second plurality of interlayer vias formed between the first and second conductive layers, wherein each of the second plurality of interlayer vias electrically couple respective ones of the second plurality of ribs to the second spine at the respective portions of overlap; and
a third spine formed on the first conductive layer, disposed between and running parallel to the first and second spines,
wherein each of the second plurality of ribs are staggered with respect to the second spine so as to avoid a conflict with any one of the plurality of the signal lines, and wherein the second spine and the second plurality of ribs form at least a second portion of the power network.

3. The integrated circuit of claim 2 wherein the second plurality of ribs are staggered with respect to the second spine in an identical configuration as that of the first plurality of ribs staggered with respect to the first spine.

4. The integrated circuit of claim 2 wherein the second plurality of ribs are staggered with respect to the second spine in a mirror-opposite configuration as that of the first plurality of ribs staggered with respect to the first spine.

5. The integrated circuit of claim 2 wherein the first and second plurality of ribs share at least one common rib having a first end electrically coupled to the first spine and a second end electrically coupled to the second spine, and orthogonally spanning across the third spine.

6. The integrated circuit of claim 5 wherein the first plurality of ribs comprises at least one non-common first rib staggered with respect to the first spine in a direction away from the second spine, and the second plurality of ribs comprises at least one non-common second rib staggered with respect to the second spine in a direction away from the first spine.

7. The integrated circuit of claim 2 wherein the plurality of signal lines comprises a first plurality of signal lines disposed between the first and third spines and a second plurality of signal lines disposed between the second and third spines.

8. The integrated circuit of claim 7 wherein the first plurality of signal lines form at least a portion of a first cell of the integrated circuit, and the second plurality of signal lines form at least a portion of a second cell of the integrated circuit, wherein the second cell is immediately adjacent to the first cell.

9. The integrated circuit of claim 7 wherein the plurality of signal lines further comprises at least one long signal line that spans across the third spine substantially an entire distance between the first and second spines, and wherein the first and second plurality of signal lines and the at least one long signal line form at least a portion of a single wide cell that spans substantially the entire distance between the first and second spines.

10. An integrated circuit, comprising:
a first spine formed on a first conductive layer of the integrated circuit, wherein the spine runs along a first axis;
a first plurality of ribs formed on a second conductive layer of the integrated circuit, wherein the first plurality of ribs run parallel to one another along a second axis that is orthogonal to the first axis and overlap respective portions of the first spine;
a first plurality of interlayer vias formed between the first and second conductive layers, wherein each of the plurality of interlayer vias electrically couple respective ones of the first plurality of ribs to the first spine at the respective portions of overlap;
a second spine formed on the first conductive layer and running parallel to the first spine;
a second plurality of ribs formed on the second conductive layer and running parallel to one another along the second axis so as to orthogonally overlap respective portions of the second spine;
a second plurality of interlayer vias formed between the first and second conductive layers, wherein each of the second plurality of interlayer vias electrically couple respective ones of the second plurality of ribs to the second spine at the respective portions of overlap; and
a plurality of signal lines formed on the second conductive layer and running parallel to one another along the second axis,
wherein each of the first plurality of ribs are staggered with respect to the first spine so as to avoid a conflict with any one of the plurality of the signal lines, and wherein the first spine and the first plurality of ribs form at least a first portion of the power network that supplies power to the integrated circuit,
and wherein each of the second plurality of ribs are staggered with respect to the second spine so as to avoid a conflict with any one of the plurality of the signal lines, and wherein the second spine and the second plurality of ribs form at least a second portion of the power network.

11. The integrated circuit of claim 10, further comprising: a third spine formed on the first conductive layer, disposed between and running parallel to the first and second spines.

12. The integrated circuit of claim 10, wherein the second plurality of ribs are staggered with respect to the second spine in an identical configuration as that of the first plurality of ribs staggered with respect to the first spine.

13. The integrated circuit of claim 10, wherein the second plurality of ribs are staggered with respect to the second spine in a mirror-opposite configuration as that of the first plurality of ribs staggered with respect to the first spine.

14. The integrated circuit of claim 10, wherein the first and second plurality of ribs share at least one common rib having a first end electrically coupled to the first spine and a second end electrically coupled to the second spine, and orthogonally spanning across the third spine.

15. The integrated circuit of claim 14, wherein the first plurality of ribs comprises at least one non-common first rib staggered with respect to the first spine in a direction away from the second spine, and the second plurality of ribs comprises at least one non-common second rib staggered with respect to the second spine in a direction away from the first spine.

16. The integrated circuit of claim 10, wherein the plurality of signal lines comprises a first plurality of signal lines disposed between the first and third spines and a second plurality of signal lines disposed between the second and third spines.

17. The integrated circuit of claim 15, wherein the first plurality of signal lines form at least a portion of a first cell of the integrated circuit, and the second plurality of signal lines form at least a portion of a second cell of the integrated circuit, wherein the second cell is immediately adjacent to the first cell.

18. The integrated circuit of claim 15, wherein the plurality of signal lines further comprises at least one long signal line that spans across the third spine substantially an entire distance between the first and second spines, and wherein the first and second plurality of signal lines and the at least one long signal line form at least a portion of a single wide cell that spans substantially the entire distance between the first and second spines.

* * * * *